Oct. 28, 1958 G. L. PEARSON 2,858,246

SILICON SINGLE CRYSTAL CONDUCTOR DEVICES

Filed April 22, 1957 2 Sheets-Sheet 1

INVENTOR
G. L. PEARSON
BY H W Lockhart
ATTORNEY

Oct. 28, 1958 G. L. PEARSON 2,858,246

SILICON SINGLE CRYSTAL CONDUCTOR DEVICES

Filed April 22, 1957 2 Sheets-Sheet 2

INVENTOR
G. L. PEARSON
BY H. W. Lockhart
ATTORNEY

United States Patent Office 2,858,246
Patented Oct. 28, 1958

2,858,246

SILICON SINGLE CRYSTAL CONDUCTOR DEVICES

Gerald L. Pearson, Bernards Township, Somerset County, N. J., assignor to Bell Telephone Laboratories, Incorporated, New York, N. Y., a corporation of New York Application April 22, 1957, Serial No. 654,383

3 Claims. (Cl. 148—33)

This invention relates to semiconductor devices having minute regularly shaped surface alloy regions defining p-n junctions with the base material and more particularly to a method of fabricating such devices.

In one aspect, this invention involves the discovery of the interrelation between the crystallographic structure of a single crystal body of semiconductive material and the shape and dimensions of minute alloyed regions on certain surfaces thereof. Specifically, it has been found that if a single crystal silicon body having minute impurity areas on those surfaces which define specific crystallographic planes is heated to a temperature just below the melting point of the silicon and quenched rapidly, straight sided geometrical patterns several microns in extent are formed and their shapes are uniquely determined by the surface crystal plane. These patterns are squares on a {100} crystal surface, equilateral triangles on a {111} surface, isosceles triangles on a {211} surface, and parallel striations on the {110} surface, and comprise alloy regions of comparatively shallow depth. By selecting impurities having the property of altering the conductivity type, these surface alloyed regions may define p-n junctions with the base material.

Although patterns of the other types may find specific utility, this invention is directed chiefly to devices in which the surface melting phenomena is effected on {100} planes to provide minute alloyed areas of square configuration. These areas are of microscopic size and generally will not exceed about one hundred microns on a side.

In general, an object of this invention is an improved semiconductor device. More specifically, an object is a semiconductor device having a large number of minute discrete surface regions of conductivity type opposite to that of the base material and having uniform geometrical configuration.

A further object is a method of facilely producing such devices.

In accordance with one exemplary embodiment of this invention, a single crystal body of silicon is provided having a major surface in the {100} plane. Minute quantities of a significant impurity material are placed at discrete locations on this major surface. In this connection, the silicon body may be of n- or p-type conductivity as produced by any of a variety of methods now well-known to those skilled in the art. The term "significant impurity" refers to elements generally known as donors and acceptors and in this specific method they are selected so as to produce an alteration in the conductivity type of the alloyed region, thereby providing a p-n junction at the juncture of the surface region and the main portion of the body.

The silicon body is heated to just below the melting point and allowed to cool rapidly. As a result, a large number of discrete alloyed regions are produced on the {100} plane surface, each of which is of square shape and several microns in width. Silicon bodies produced in this manner are advantageously used in applications requiring a device having a mosaic of p-n junction regions such as, for example, the target element of a television pick-up tube, of the type disclosed in the U. S. Patent 2,415,842 issued February 18, 1947, to B. M. Oliver. The minuteness of the alloyed areas enables the provision of a large number of such p-n junction regions thereby affording a considerable improvement in the picture definition of such tubes.

Although the invention in its primary aspects relates to semiconductor target devices, it will be appreciated that the invention may be applied to other structures in which semiconductor bodies having arrays of minute alloy regions thereon may find use.

One feature of this invention is the method of fabricating devices which involves briefly passing a high electric current through the body to raise its temperature to accomplish the alloying step and allowing the body to cool rapidly in the ambient atmosphere.

The invention and its further objects and features will be better understood from a consideration of the following description taken in connection with the drawing in which.

Figure 1:
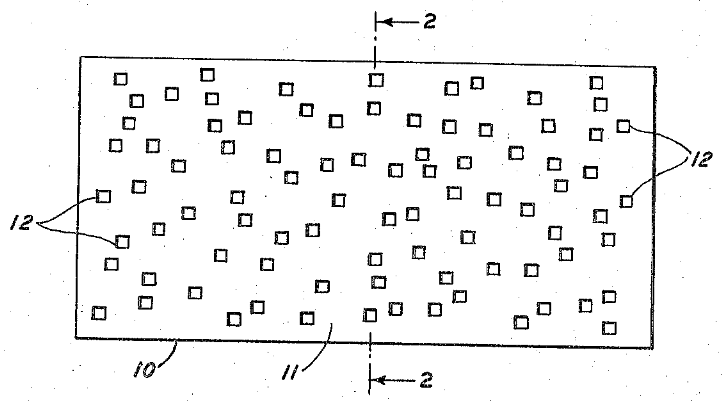
Fig. 1 is a view of the target side of a body of single crystal semiconductive material upon which an array of square alloyed regions have been produced by the method of this invention for use in a beam-type television camera tube.

Referring particularly to the drawing, Fig. 1 shows a rectangular wafer 10 of silicon which has been fabricated in accordance with this invention. The wafer 10 is a monocrystalline body and may be, for example, one-half by one inch in area and have a thickness of 0.010 inch. Such a wafer may be fabricated from a single-crystal ingot, for example, of n-conductivity type produced by the zone-melting method disclosed in U. S. Patent 2,739,088 issued March 20, 1956, to W. G. Pfann. It is important that, in accordance with this invention, the wafer 10 is fabricated with a major face in a crystallographic plane which will result in the desired surface melt patterns. In this specific embodiment, the wafer is sliced and shaped from the ingot so that the face 11 is oriented in the {100} plane.

After the wafer has been formed to the desired configuration by shaping methods well-known to those skilled in the art, the one major face 11 is treated by likewise well-known techniques so as to present a fresh, clean surface.

The face 11 alone is then treated so as to deposit minute particles of an acceptor impurity thereon. In one specific method, the face 11 is covered by a mask composed of a thin metal sheet having an array of very small holes therein. Such a mask is made advantageously by an electro-forming process which results in very small orifices. The wafer is then exposed in an atmosphere of aluminum vapor such as is produced using a filamentary heater coated with aluminum by methods well-known to those skilled in the art. It is necessary to ensure that aluminum is not deposited on the other surfaces of the wafer, which, for this purpose, may be coated with a masking agent such as Apiezon wax. As a result of this step, an array of very small discrete areas of aluminum is deposited on the face 11. Each such minute area then serves as the nucleus of a surface alloy region produced by the subsequent heating step.

Following the removal of the mask and masking agent, the wafer 10 is heated to a temperature of about 1410 degrees centigrade which is just below the melting point of silicon, usually taken as 1415 degrees centigrade. It should be appreciated that the temperature of about 1410 degrees centigrade is considerably higher than the aluminum-silicon eutectic of 577 degrees centigrade and is required by the very small amount of aluminum deposited and by the desirability of rapid accomplishment of the alloying process. Advantageously, this heating step is accomplished rapidly and facilely by connecting the wafer 10 in series with a large electric current source. By thus applying a heavy current the silicon wafer is rapidly heated to a white-hot condition just short of the molten state. The large heat of fusion enables the operator to heat the wafer to the desired temperature with little danger of achieving the completely molten condition. The current is turned off and the semi-conductive body cools rapidly in a room temperature ambient. It will be appreciated that other heating methods also may be used, such as, for example, induction heating.

It is important during the foregoing processing to maintain the silicon body free from undesired contaminating impurities which may alter the final structure of the device.

When the wafer 10 has cooled, microscopic observation discloses that the face 11 is largely covered with an array of sharply-defined square regions 12. Each of these regions 12 is a shallow zone of p-type conductivity produced by the alloying of a minute particle of the acceptor impurity aluminum with the adjacent underlying silicon.

Figure 2:
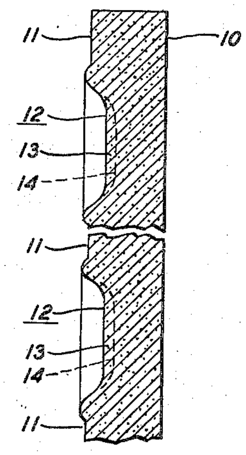
Fig. 2 is a portion of the section of the device of Fig. 1 taken along the line 2—2, enlarged several times.

Referring to Fig. 2, cross-sectional views of two of the regions 12 indicate the almost rectangular depression formed by the surface melting phenomena. There will, of course, be a corresponding slight build-up of material around the depressed alloy zone.

At the base of the depression the p-type conductivity zone is shown in cross section as the area 13 defined by the p-n junction 14, drawn in dotted outline. The structure thus disclosed comprises a semiconductive wafer of n-type conductivity having an array of square p-type conductivity regions on one surface.

Figure 4:
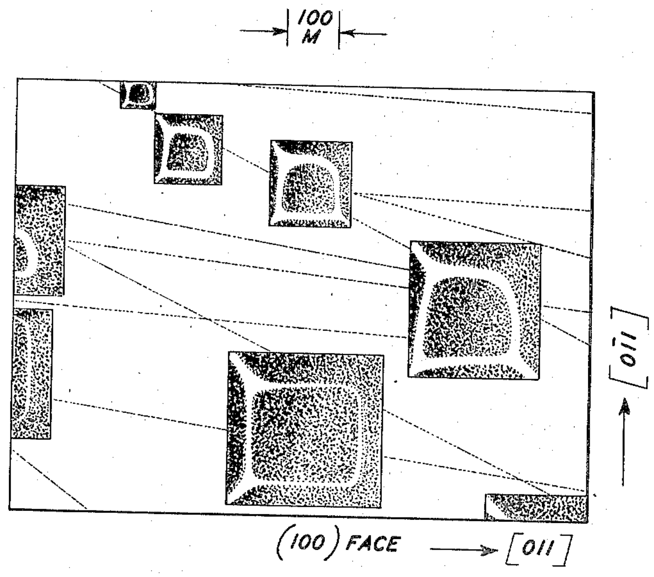
Fig. 4 is a magnified view of a portion of the surface of a body of single crystal silicon showing the surface of the {100} plane with alloyed regions thereon.
Figure 5:
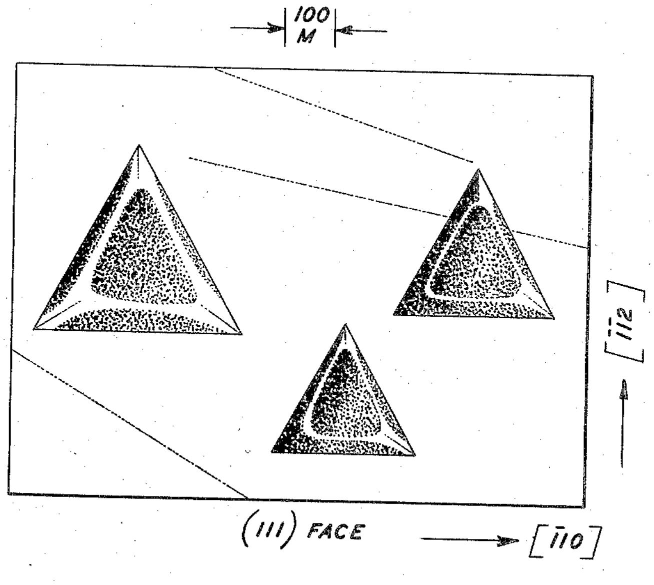
Fig. 5 is a view similar to Fig. 4 showing, however, alloyed regions on the {111} face.

Fig. 4 shows a portion of a {100} plane surface of a single-crystal silicon which has been subjected to the surface melting technique, magnified one hundred times. The alloy regions 20 are seen to be sharply-defined squares of different sizes depending to some extent upon the original impurity particles size, and the temperature and duration of heating. Fig. 5 is a similar view of the surface melting phenomena on the {111} crystallographic plane of a single-crystal silicon body. In this instance the patterns are rather precise equilateral triangles.

Figure 3:
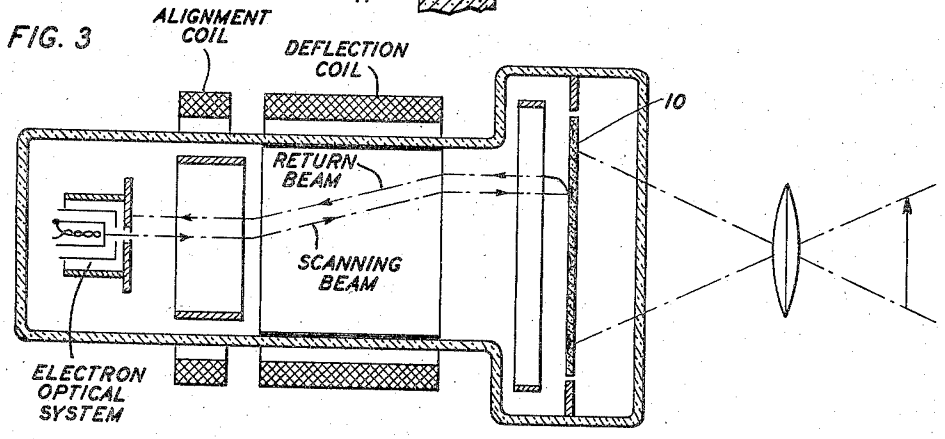
Fig. 3 is a schematic representation of a cathode-ray tube incorporating a target device of the type shown in Fig. 1.

The semiconductor device exemplified in Figs. 1 and 2 may be used in the beam-type cathode-ray tube of the type depicted in Fig. 3. Reference may be had to the aforenoted patent to Oliver and to U. S. Patent 2,749,463, issued June 5, 1956, to J. R. Pierce for additional details in connection with the structure and operation of such tubes.

Referring to Fig. 3, an electro-optical device for use in television cameras is shown in general form with certain elements not essential to the disclosure of this invention omitted for greater clarity. This structure is similar to the image orthicon type of tube disclosed in the aforenoted patent to Pierce. As is more fully disclosed by the aforesaid patents of Oliver and Pierce, the silicon wafer 10 functions as the target element of such a tube to translate an optical image into an electrical image. The tube of Fig. 3 thus is most advantageously used in low definition television systems such as might be used with the telephone. By using a wafer having the large number of alloy junction regions on one surface in accordance with this invention, a considerable improvement in resolving power of the system is achieved.

In connection with the unique geometrical patterns produced by the surface melting technique of this invention, it has been determined that the particular pattern formed on selected crystal surfaces is determined by the {111} crystal planes. Thus, when the semiconductor wafer is heated to just below its melting point, the alloy regions are formed in the molten state and are drawn into small hemispheres by surface tension. When the water is cooled the close packed {111} planes of the diamond cubic crystal, to which the silicon atoms are most tightly bound, are revealed.

Although one specific embodiment of this invention is disclosed herein, it will be appreciated that the invention may find use wherever a semiconductive translating device having an array of minute alloy junction regions of definite geometrical shape on certain surfaces thereof is required. Various modifications can be made in the embodiment described above without departing from the spirit or scope of the invention.

What is claimed is:

1. A semiconductor translating element for an electron beam device comprising a body of single crystal silicon of n-type conductivity having one major surface in the {100} plane, and an array of discrete square regions of shallow depth and of p-type conductivity in said major surface, said square regions being defined by the crystalline structure of said body.

2. A semiconductor translating element comprising a body of single crystal silicon of n-type conductivity having one major surface in the {111} plane, and an array of discrete regions in the form of equilateral triangles of shallow depth and of p-type conductivity in said major surface, said triangular regions being defined by the crystalline structure of said body.

3. A semiconductor translating element comprising a body of single crystal silicon of n-type conductivity having one major surface in the {211} plane, and an array of discrete regions in the form of isosceles triangles of shallow depth and of p-type conductivity in said major surface, said triangular regions being defined by the crystalline structure of said body.

References Cited in the file of this patent

UNITED STATES PATENTS

| | | |
|---|---|---|
| 2,773,925 | Rothlein et al. | Dec. 11, 1956 |
| 2,789,068 | Maserjian | Apr. 16, 1957 |